United States Patent
Kunikiyo

[11] Patent Number: 5,854,509
[45] Date of Patent: Dec. 29, 1998

[54] METHOD OF FABRICATING SEMICONDUCTOR DEVICE AND SEMICONDUCTOR DEVICE

[75] Inventor: Tatsuya Kunikiyo, Tokyo, Japan

[73] Assignee: Mitsubishi Denki Kabushiki Kaisha, Tokyo, Japan

[21] Appl. No.: 641,819

[22] Filed: May 2, 1996

[30] Foreign Application Priority Data

Nov. 9, 1995 [JP] Japan ................................. 7-290799

[51] Int. Cl.$^6$ ................................................. H01L 27/92
[52] U.S. Cl. ...................... 257/506; 257/514; 257/515; 257/520; 257/521; 438/151; 438/197; 438/226; 438/701; 438/713
[58] Field of Search ...................... 251/506, 514, 251/515, 520, 521; 438/151, 197, 226, 701, 713

[56] References Cited

U.S. PATENT DOCUMENTS 3,579,058   5/1971   Armgarth .............................. 257/515
4,763,183   8/1988   Ng et al. .

OTHER PUBLICATIONS

Joachim N. Burghartz, et al, "Partial–SOI Isolation Structure for Reduced Bipolar Transistor Parasitics", *IEEE Electron Device Letters*, vol. 13, No. 8, Aug. 1992.

IEDM, pp. 479–482, 1993, P.U. Kenkare, et al., "Sensitivity of Field Isolation Profiles ot Active Pattern" Jan.

J. Electrochem. Soc., vol. 136, No. 12, pp. 3815–3820, Dec. 1989, R. L. Guldi, et al., "Characterization of Poly–Buffered Locos in Manufacturing Environment".

*Primary Examiner*—Edward Wojciechowicz
*Attorney, Agent, or Firm*—Oblon, Spivak, McClelland, Maier & Neustadt, P.C.

[57] ABSTRACT

Ordinary anisotropic etching is performed up to a depth (d1) while anisotropic etching is performed to form an inward taper from the depth (d1) by changing etching conditions such as components in a vapor phase and the temperature of a silicon substrate (1), thereby forming a groove (20). Thereafter silicon is epitaxially grown in the groove (20), thereby forming an epitaxial silicon layer (4). An NMOS transistor is formed on an upper layer part of the epitaxial silicon layer (4). At this time, the taper of the groove (20) is located under a part of an n$^+$layer (8) forming the NMOS transistor. Thus, a method of fabricating a semiconductor device capable of performing element isolation with neither halation nor formation of bird's beak in fabrication while minimizing a leakage current flowing across elements is obtained.

19 Claims, 12 Drawing Sheets

METHOD OF FABRICATING SEMICONDUCTOR DEVICE AND SEMICONDUCTOR DEVICE

BACKGROUND OF THE INVENTION

1. Field of the Invention

The present invention generally relates to a method of fabricating a semiconductor device and a semiconductor device, and more particularly, it relates to a method of fabricating a semiconductor device which is in a structure of isolating elements from each other by an oxide film and a semiconductor device.

2. Description of the Background Art

While the degree of integration is improved with refinement of semiconductor elements, one of factors deciding the degree of integration is element isolation. Five requirements for element isolation are a small element-to-element leakage current, a high isolation withstand voltage, a flat element isolation region with respect to element regions, a small element isolation region and small stress on ends of the element isolation region. The element isolation technique is now surveyed and problems thereof are listed.

Typical techniques of the element isolation include a LOCOS (local oxidation of silicon) method, an improved LOCOS method and a trench method. The LOCOS method is adapted to selectively oxidize a silicon substrate for employing the as-formed thermal oxidation film as an element isolation region.

FIGS. 14 to 17 are sectional views showing a process flow of the conventional LOCOS method. The process of the LOCOS method is now described with reference to these figures.

As shown in FIG. 14, a thin oxide film 22 is first formed on a silicon substrate 21, and a nitride film 23 is deposited on the oxide film 22. The oxide film 22 is adapted to prevent the silicon substrate 21 from development of crystal defects resulting from stress which is applied by the nitride film 23.

As shown in FIG. 15, parts of the oxide film 22 and the nitride film 23 are removed by etching, to leave only portions for forming an element region. Then, the films are oxidized in this state. The portion under the nitride film 23 is hardly oxidized since the diffusion coefficient of an oxidizer is small in the nitride film 23, and only a portion exposing the silicon substrate 21 is selectively oxidized.

Consequently, a LOCOS oxide film 24 having a large thickness is selectively formed as shown in FIG. 16. This LOCOS oxide film 24 serves as element isolation film. Then, the nitride film 23 is removed by etching, as shown in FIG. 17. The LOCOS oxide film 24 is smoothly connected with the silicon substrate 21 at each end portion of the element isolation region. Therefore, each end portion of the element isolation region has a smoothly tapered section called a bird's beak 25. This bird's beak 25, which is effective for flattening, is substantial enlargement of the element isolation region, and results in a problem in improvement of the degree of integration.

In order to reduce the length of the bird's beak, the conventional LOCOS method has been improved. Such a method is generally called an improved LOCOS method.

FIGS. 18 to 21 are sectional views showing a first mode of such an improved LOCOS method. With reference to FIGS. 18 to 21, the first mode of the improved LOCOS method is now described.

As shown in FIG. 18, an oxide film 42, a polysilicon film 43 and a nitride film 44 are first successively deposited on a silicon substrate 41. Then, the nitride film 44 is selectively removed by etching for partially exposing the polysilicon film 43, as shown in FIG. 19.

Then, a LOCOS oxide film 45 is formed by oxidation as shown in FIG. 20, for defining an element isolation region 26. In such oxidation, an oxidizer is diffused in the polysilicon film 43 and the silicon substrate 41 and the amount of the oxidizer reaching the silicon substrate 41 is reduced as compared with the case provided with no polysilicon film 43, whereby the length of a bird's beak is suppressed. Then, the nitride film 44, the polysilicon film 43 and the oxide film 42 are removed by etching, whereby elements can be isolated from each other by the LOCOS oxide film 45, as shown in FIG. 21.

In this method, however, inclination of an end (where a bird's beak is formed) of the LOCOS oxide film 45 is so steep that light is partially reflected by the slope at the end of the LOCOS oxide film 45 when a gate electrode is patterned in a transfer step and applied to the gate electrode from a side surface, to disadvantageously cause such a phenomenon, called halation, that the gate electrode is not patterned along a mask pattern.

FIG. 22 is a sectional view for illustrating the halation phenomenon. A gate electrode part is formed by a gate oxide film 27 and a polysilicon film 28, while a wire is formed by a tungsten silicide layer 29. A resist layer 30 and a mask 31 are employed for patterning a gate electrode. The resist layer 30, which is of a positive type, is decomposed when light is applied thereto. When there is no halation, the gate electrode is patterned to correctly reflect the shape of the mask 31 as shown by broken lines in FIG. 22. When there is halation, however, a beam 32 is reflected by the tungsten silicide layer 29 and the light is applied also from a side surface of a portion of the resist layer 30 which is covered with the mask 31, and hence a resist film 33 is disadvantageously patterned as shown by solid lines in FIG. 22

When anisotropic etching is performed through the resist film 33 serving as a mask, a trapezoidal gate electrode 46 is formed as shown in FIG. 23.

FIGS. 24 to 26 are sectional views showing a second mode of the improved LOCOS method. With reference to FIGS. 24 to 26, the second mode of the improved LOCOS method is now described.

As shown in FIG. 24, a silicon substrate 51 is partially removed by etching in a tapered manner, an oxide film 52 is formed on the overall surface, and a nitride film 53 is deposited on the overall surface, to be thereafter partially removed by etching.

Then, oxidation is so performed as to form a LOCOS oxide film 54 as shown in FIG. 25. Thereafter the nitride film 53 is removed, as shown in FIG. 26. The LOCOS oxide film 54 is formed on a portion from which the silicon substrate 51 is removed by etching, whereby a step between an element isolation region and an element region is reduced. Thus, the problem of halation is avoided, while a bird's beak is still inevitably formed.

A trench isolation method is adapted to avoid both of the problems of the bird's beak and halation. FIGS. 27 to 29 are sectional views showing the trench isolation method. The trench isolation method is now described with reference to FIGS. 27 to 29.

First, an oxide film 22 is formed on the overall surface of a silicon substrate 21, and thereafter a nitride film 23 is deposited on the overall surface. Then, regions other than that provided with a trench are covered with a resist layer (not shown). This resist layer is employed as a mask to anisotropically etch the nitride film 23, the oxide film 22 and the silicon substrate 21, whereby a trench 34 is defined. Then, boron 35 is injected into bottom and side surfaces of the trench 34 in order to prevent an element-to-element leakage current, whereby an impurity layer 36 of boron is formed as shown in FIG. 27.

The bottom surface and a side wall of the trench 34 are cleaned and the interior of the trench 34 is thinly thermally oxidized to form a thermal oxidation film 39 as shown in FIG. 28. Then, a CVD (chemical vapor deposition) oxide film 37 is deposited in a thickness filling up the interior of the trench 34, thereby forming a trench isolation region 38 as shown in FIG. 29.

The trench isolation method has neither bird's beak nor problem of halation. However, stress is caused when the thin oxide film is formed in the trench 34, and hence a small leakage current is developed across the elements.

As hereinabove described, the conventional element isolation methods have various problems such as halation, a bird's beak and a small leakage current across elements.

SUMMARY OF THE INVENTION

According to a first aspect of the present invention, a method of fabricating a semiconductor device which is subjected to element isolation by an oxide film comprises the steps of (a) preparing a semiconductor substrate, (b) forming an oxide film on the semiconductor substrate, (c) selectively removing the oxide film for forming a groove and filling up the groove thereby forming a semiconductor region so that the groove is internally tapered in a portion which is deeper than a prescribed depth from a surface of the oxide film, and (d) forming a semiconductor element in a region of the semiconductor region which is shallower than the prescribed depth, while the step (d) is adapted to form the semiconductor element so that the taper of the groove is positioned below at least a part of a diffusion region forming the semiconductor element.

According to a second aspect of the present invention, the step (c) comprises the steps of (c-1) selectively removing the oxide film for forming the groove passing through a part of the oxide film and having a bottom surface which is defined by an exposed surface of the semiconductor substrate, and (c-2) filling up the groove for forming the semiconductor region.

According to a third aspect of the present invention, the step (c-2) comprises the steps of (c-2-1) forming an amorphous layer on the bottom surface of the groove, and (c-2-2) filling up the groove for forming a partial semiconductor region which is different in semiconductor type from the semiconductor substrate and forming the semiconductor region by the amorphous layer and the partial semiconductor region.

According to a fourth aspect of the present invention, the step (c) comprises the steps of (c-1) selectively removing the oxide film for forming the groove without passing through the oxide film, and (c-2) filling up the groove for forming the semiconductor region.

According to a fifth aspect of the present invention, the step (c-2) is adapted to form the semiconductor region to leave an unfilled space in an upper part of the groove.

According to a sixth aspect of the present invention, the step (c) comprises the steps of (c-1) selectively removing the oxide film for forming a through groove passing through a part of the oxide film, (c-2) filling up the through groove for forming a monocrystalline semiconductor region, and (c-3) oxidizing the surface of the semiconductor substrate for forming a second oxide film and blocking the bottom portion of the through groove with the second oxide film for forming the groove having a bottom portion which is defined by the second oxide film.

According to a seventh aspect of the present invention, the groove includes a plurality of grooves and the semiconductor region includes a plurality of semiconductor regions, the step (c) is adapted to fill up the plurality of grooves for forming the plurality of semiconductor regions respectively, and the plurality of semiconductor regions are formed by epitaxy with seeds which are defined by the semiconductor substrate respectively, while impurity distributions of the plurality of semiconductor regions are set to be different from each other.

According to an eighth aspect of the present invention, a semiconductor device comprises a semiconductor substrate, an oxide film which is formed on the semiconductor substrate to be provided on its surface with a groove having an opening so that the groove is inwardly tapered in a portion which is deeper than a prescribed depth from the surface of the oxide film, a semiconductor region which is formed by filling up the groove, and a semiconductor element formed in a region of the semiconductor region which is shallower than the prescribed depth so that the taper of the groove is positioned below at least a part of a diffusion region forming the semiconductor element.

According to a ninth aspect of the present invention, the bottom surface of the groove is defined by the surface of the semiconductor substrate.

According to a tenth aspect of the present invention, the bottom surface of the groove is defined by a part of the oxide film.

According to an eleventh aspect of the present invention, the height of the surface of the semiconductor region is lower than that of the surface of the oxide film, and a part of the semiconductor element is formed above the semiconductor region, while the uppermost part of the semiconductor element is flush with the surface of the oxide film.

According to a twelfth aspect of the present invention, the semiconductor region comprises an amorphous layer which is formed on the bottom surface of the groove, and a partial semiconductor region which is formed on the amorphous layer by filling up the groove, while the partial semiconductor region is different in semiconductor type from the semiconductor substrate.

In the method of fabricating a semiconductor device according to the first aspect of the present invention, the groove formed in the step (c) is inwardly tapered in the portion which is deeper than the prescribed depth from the surface of the oxide film while the semiconductor element is formed in the region of the semiconductor region which is shallower than the prescribed depth in the step (d), whereby the region provided with the semiconductor element is not influenced by the taper.

The portion of the groove which is deeper than the prescribed depth is inwardly tapered in the step (c) and the semiconductor element is so formed that the taper is positioned below at least a part of the diffusion region for forming the semiconductor element in the step (d), whereby the depletion layer can be suppressed from reaching the surface of the semiconductor substrate by the taper of the groove when a reverse vias is applied to the diffusion region for forming the semiconductor element.

Consequently, the sheet resistivity of the diffusion region for forming the semiconductor element can be sufficiently reduced, and the isolation withstand voltage of the device can be improved.

In addition, the remaining thermal oxide film is brought into an element isolation oxide film after the groove is formed in the oxide film in the step (c), whereby no bird's beak is caused.

Further, the treatment of forming the oxide film which is carried out in the step (b) is not local oxidation treatment, whereby no stress is caused by the oxidation in the step (b). Therefore, no fine leakage current flows across the semiconductor element and another semiconductor element.

In the method of fabricating a semiconductor device according to the second aspect of the present invention, the groove having a bottom surface defined by the exposed surface of the semiconductor substrate is formed in the step (c-1), whereby a monocrystalline semiconductor region can be formed through epitaxy from a seed defined by the semiconductor substrate in the step (c-2).

Consequently, the semiconductor device fabricated by the fabrication method according to the second aspect of the present invention improves the carrier mobility of the semiconductor element which is formed in the semiconductor region, whereby a semiconductor element having a high operating speed can be formed.

In the method of fabricating a semiconductor device according to the third aspect of the present invention, the partial semiconductor region is different in semiconductor type from the semiconductor substrate, whereby the partial semiconductor region can be prepared from a semiconductor of a type which is suitable for the operating performance of the semiconductor element with no dependency on the semiconductor type of the semiconductor substrate.

Further, a bad influence resulting from the difference in semiconductor type between the semiconductor substrate and the partial semiconductor region can be relaxed by providing the amorphous layer therebetween.

In the method of fabricating a semiconductor device according to the fourth aspect of the present invention, the step (c-1) is adapted to form the groove without passing through the oxide film, whereby the semiconductor region provided with the semiconductor element presents the so-called SOI (semiconductor (silicon) on insulator) structure which is formed on the semiconductor substrate through an insulating film (oxide film).

Consequently, the semiconductor device which is fabricated by the fabrication method according to the fourth aspect of the present invention has an effect of hardly causing a soft error resulting in a malfunction of the semiconductor element by secondary carriers, due to the SOI structure.

In the method of fabricating a semiconductor device according to the fifth aspect of the present invention, the step (c-2) is adapted to form the semiconductor region to leave an unfilled space in an upper part of the groove, whereby the uppermost portion of the semiconductor element can be flush with the surface of the oxide film also when a part of the semiconductor element is formed above the semiconductor region.

Consequently, wires can be relatively readily flattened and formed in small thicknesses when the same are formed on the semiconductor element.

In the method of fabricating a semiconductor device according to the sixth aspect of the present invention, the through groove having a bottom surface which is defined by the exposed surface of the semiconductor substrate is formed in the step (c-1), whereby a monocrystalline semiconductor region can be formed through epitaxy from a seed defined by the semiconductor substrate in the step (c-2).

In addition, the step (c-3) is adapted to form the groove having a bottom portion defining a second oxide film by blocking the bottom portion of the through groove with the second oxide film, whereby the semiconductor region presents an SOI structure which is formed on the semiconductor substrate through an insulating film (oxide film).

Consequently, the semiconductor device which is fabricated by the fabrication method according to the sixth aspect of the present invention can form a semiconductor element having a high operating speed by improving carrier mobility of the semiconductor element which is formed in the semiconductor region, and has an effect of hardly causing a soft error resulting in a malfunction of the semiconductor element by secondary carriers.

In the method of fabricating a semiconductor device according to the seventh aspect of the present invention, the plurality of semiconductor regions are formed by epitaxy from a seed which is defined by the semiconductor substrate while impurity distributions of the plurality of semiconductor regions are set at different values respectively, whereby impurity distributions suitable for the semiconductor elements formed in the interior can be set.

In the semiconductor device according to the eighth aspect of the present invention, the groove is inwardly tapered in the portion which is deeper than the prescribed depth from the surface of the oxide film while the semiconductor element is formed in the region of the semiconductor region which is shallower than the prescribed depth, whereby the region provided with the semiconductor element is not influenced by the taper.

The taper of the groove is positioned below at least a part of the diffusion region for forming the semiconductor element, whereby the depletion layer can be suppressed from reaching the surface of the semiconductor substrate by the taper of the groove when a reverse vias is applied to the diffusion region for forming the semiconductor element.

Consequently, the sheet resistivity of the diffusion region for forming the semiconductor element can be sufficiently reduced, and the isolation withstand voltage of the device can be improved.

In the semiconductor device according to the ninth aspect of the present invention, the bottom surface of the groove is defined by the surface of the semiconductor substrate, whereby a monocrystalline semiconductor region can be formed by epitaxy from a seed which is defined by the semiconductor substrate.

Consequently, the semiconductor device according to the ninth aspect of the present invention improves the carrier mobility of the semiconductor element which is formed in the semiconductor region, whereby a semiconductor element having a high operating speed can be obtained.

In the semiconductor device according to the tenth aspect of the present invention, the bottom surface of the groove is defined by a part of the oxide film, whereby the semiconductor region provided with the semiconductor element presents an SOI structure which is formed on the semiconductor substrate through an insulating film (oxide film).

Consequently, the semiconductor device according to the tenth aspect of the present invention hardly causes a soft error resulting in a malfunction of the semiconductor element by secondary carriers, due to the SOI structure.

In the semiconductor device according to the eleventh aspect of the present invention, the height of the surface of the semiconductor region is lower than that of the surface of the oxide film, a part of the semiconductor element is formed above the semiconductor region, and the uppermost part of the semiconductor element is flush with the surface of the oxide film, whereby wires can be relatively readily flattened and formed in small thicknesses when the same are formed on the semiconductor device.

In the semiconductor device according to the twelfth aspect of the present invention, the partial semiconductor region is different in semiconductor type from the semiconductor substrate, whereby the partial semiconductor region can be prepared from a semiconductor of a type which is suitable for the operating performance of the semiconductor element with no dependency on the semiconductor type of the semiconductor substrate.

Further, a bad influence resulting from the difference in semiconductor type between the semiconductor substrate and the partial semiconductor region can be relaxed by providing the amorphous layer therebetween.

Accordingly, an object of the present invention is to obtain a method of fabricating a semiconductor device which can isolate elements from each other with neither halation nor formation of a bird's beak in fabrication while minimizing a leakage current flowing across the elements, and a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Embodiment 1>

FIGS. 1 to 4 are sectional views showing an element isolation method according to an embodiment 1 of the present invention. With reference to FIGS. 1 to 4, the element isolation method is now described.

Figure 1:
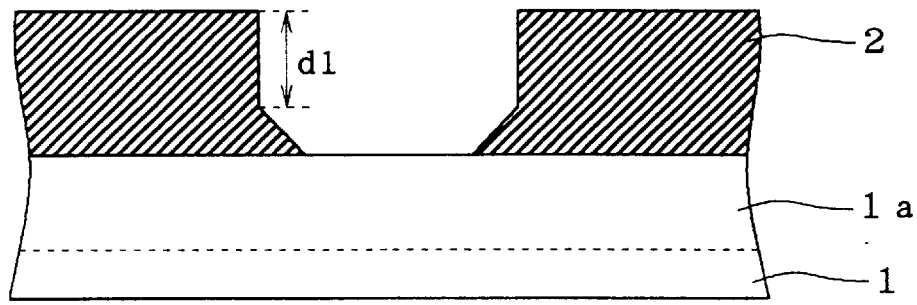
FIG. 1 is a sectional view showing an element isolation method according to an embodiment 1 of the present invention.

First, a silicon substrate 1 is washed and thereafter its overall surface is oxidized so that a thermal oxide film 2 is formed on the overall surface of the silicon substrate 1, as shown in FIG. 1. Then, a well region 1a is formed on an upper layer part of the silicon substrate 1 by ion implantation. The well region 1a is formed by implanting arsenic ions for an N type or boron ions for a P type. It is hereafter assumed that the silicon substrate 1 includes the well region 1a.

Thereafter a resist layer (not shown) is formed on the thermal oxide film 2 and patterned for performing anisotropic etching on the thermal oxide film 2 through the patterned resist layer serving as a mask, thereby forming a groove 20. The interior of this groove 20 defines a (semiconductor) element forming region, so that a semiconductor element is formed in this element forming region.

In formation of the groove 20, the thermal oxide film 2 is vertically removed with no taper up to a depth d1, while the same is removed with an inward taper in a portion which is deeper than the depth d1. The portion removed by the etching defines the groove 20, while the unetched remaining portion of the thermal oxide film 2 defines an element isolation film. The depth d1 is set by providing a slight allowance to a depth for forming diffusion regions of the semiconductor element.

The etching for forming the groove 20 of such a structure is performed as follows: Ordinary anisotropic etching is performed up to the depth d1, and anisotropic etching is performed from the depth d1 while changing etching conditions such as components in the vapor phase, the temperature of the silicon substrate 1 and the like for forming the inward taper.

Figure 2:
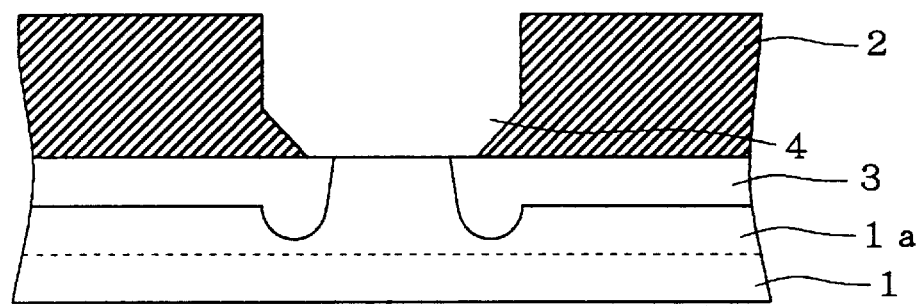
FIG. 2 is a sectional view showing the element isolation method according to the embodiment 1 of the present invention.

Then, a channel cut layer 3 is formed on an upper layer part of the silicon substrate 1 which is located under the thermal oxide film 2, as shown in FIG. 2.

Figure 3:
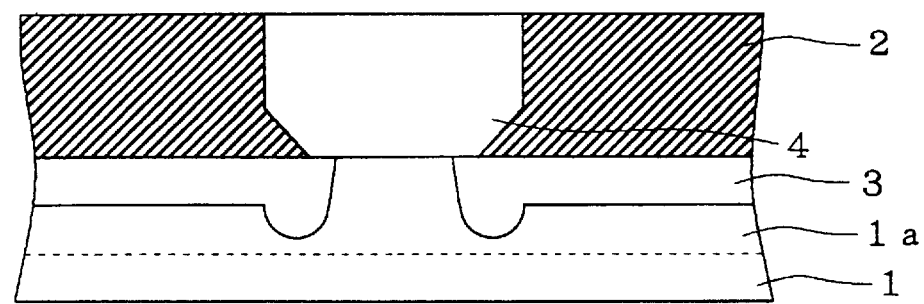
FIG. 3 is a sectional view showing the element isolation method according to the embodiment 1 of the present invention.

Then, silicon is epitaxially grown in the groove 20 from a seed which is defined by the exposed surface of the silicon substrate 1 defining the bottom surface of the groove 20, thereby forming an epitaxial silicon layer 4, as shown in FIG. 3. This epitaxial silicon layer 4 defines the element forming region. On the bottom surface of the groove 20 which is formed by the anisotropic etching, i.e., the exposed surface of the silicon substrate 1, crystal defects following etching damage are caused to result in a leakage current. In order to avoid such crystal defects, surface layer removal with a sacrifice oxide film is performed in addition to washing with a wet chemical liquid before the epitaxy as surface cleaning of the silicon substrate 1 after the anisotropic etching, thereby removing the surface of the silicon substrate 1 causing crystal defects. The "sacrifice oxide film" is an oxide film which is temporarily formed and thereafter immediately removed to be sacrificed for adjusting the shape of the groove without remaining in a structure of the element which is completed later while removing defects, distortion, contamination etc. from the interior of the groove.

The surfaces of the thermal oxide film 2 and the epitaxial layer 4, which are not necessarily flat, are flattened through a step of CMP (chemical mechanical polishing) or the like, as shown in FIG. 3.

Figure 4:
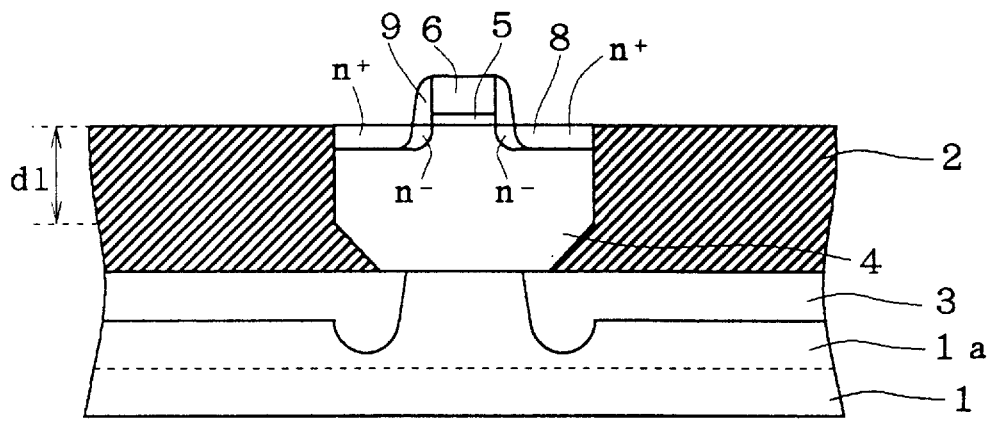
FIG. 4 is a sectional view showing the element isolation method according to the embodiment 1 of the present invention.

Then, an oxide film and a polysilicon film are successively deposited on the overall surface, and these films are patterned for forming a gate oxide film 5 and a polysilicon gate 6, as shown in FIG. 4.

The polysilicon gate 6 is employed as a mask for ion-implanting arsenic, for example, thereby forming an n⁻layer 7 in a self alignment manner. Then, an oxide film is deposited on the overall surface, and thereafter anisotropic etching is performed on this oxide film thereby forming side walls 9 on side surfaces of the polysilicon gate 6, as shown in FIG. 4.

Thereafter the polysilicon gate 6 and the side walls 9 are employed as masks for ion-implanting arsenic, for example, thereby forming an n⁺layer 8 in a self alignment manner. Thereafter a heat treatment is performed for electrically activating impurities, thereby forming an NMOS transistor. Namely, the n⁻and n⁺layers 7 and 8 define diffusion regions (drain and source regions) of the NMOS transistor. At this time, the n⁻and n⁺layers 7 and 8 are formed in a region of the groove 20 which is shallower than the depth d1, so that the taper of the groove 20 is positioned under a part of the n⁺layer 8.

While an NMOS transistor is formed in the epitaxial silicon layer 4 as a semiconductor element which is subjected to element isolation in the element isolation method according to the embodiment 1, the NMOS transistor may be replaced with a PMOS transistor, a bipolar transistor, a power element or a TFT (thin film transistor), as a matter of course.

As described above, the element isolation method according to the embodiment 1 is adapted to form the groove 20 in a part of the thermal oxide film 2 for vertically shaping this groove 20 up to the depth d1 while inwardly tapering the same in the portion deeper than the depth d1. The epitaxial silicon layer 4 which is formed in the groove 20 is employed as an element forming region so that the semiconductor element (NMOS transistor) is formed on the upper layer part of the epitaxial silicon layer 4, and the remaining thermal oxide film 2 is employed as the element isolation film.

Transverse widths at the bottom surfaces of the diffusion regions (n⁻and n⁺layers 7 and 8) forming the semiconductor element (NMOS transistor) can be sufficiently ensured for reducing sheet resistivity, by vertically forming side walls of the oxide film 2 up to the depth d1 of the groove 20.

Further, it is possible to suppress a depletion layer from reaching the channel cut layer 3 which is provided on the surface of the silicon substrate 1 by the taper of the groove 20 when a reverse bias is applied across the diffusion regions 7 and 8 of the semiconductor element by inwardly tapering the groove 20 in the portion deeper than the depth d1 so that the taper is located below at least a part of the diffusion regions forming the semiconductor element.

Consequently, the depletion layer from the diffusion regions 7 and 8 hardly reaches the channel cut layer 3 as compared with the case of forming the element isolation region by the conventional LOCOS method, whereby the isolation withstand voltage of the device is improved.

Further, the thermal oxide film 2 remaining after formation of the groove 20 is adapted to define the element isolation oxide film, to result in no bird's beak.

In addition, the thermal oxide film 2 is formed on the overall surface of the silicon substrate 1 with no local oxidation dissimilarly to the conventional LOCOS method, whereby no stress is caused by oxidation and a fine leakage current across isolated semiconductor elements can be extremely reduced.

After the formation of the groove 20 by anisotropic etching, the surface of the silicon substrate 1 causing crystal defects is subjected to surface layer removal through a sacrifice oxide film in addition to washing with a wet chemical liquid as surface cleaning before formation of the epitaxial silicon layer 4, whereby a leakage current resulting from the crystal defects can also be reliably suppressed.

<Embodiment 2>

In the element isolation method according to the embodiment 1, the thermal oxide film 2 and the epitaxial layer 4 are flattened so that the surfaces thereof are flush with each other. The structure obtained by the element isolation method according to the embodiment 1 advantageously has small halation in formation of a gate electrode, while a gate portion of the transistor disadvantageously projects from the thermal oxide film 2 and the epitaxial silicon layer 4 when wires and a protective film are further deposited from the structure shown in FIG. 4, and hence it is difficult to flatly form the wires and the protective film. Particularly as to the wires, an electric field is concentrated to irregular portions to disadvantageously reduce reliability by migration.

Figure 5:
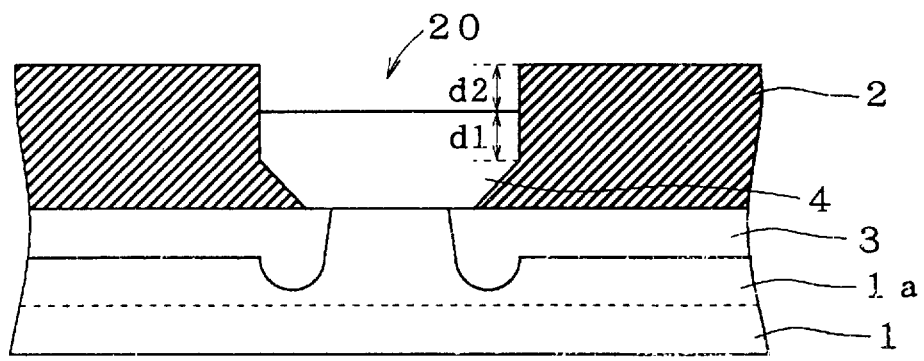
FIG. 5 is a sectional view showing an element isolation method according to an embodiment 2 of the present invention.

According to an embodiment 2 of the present invention, therefore, an epitaxial silicon layer 4 is formed in a part of a groove 20 to leave an unfilled space in an upper part of the groove 20, as shown in FIG. 5.

Assuming that d2 represents the unfilled space distance of the groove 20, the groove 20 is vertically shaped up to a depth obtained by adding the upper space distance d2 to a depth d3 and inwardly tapered in a portion deeper than the depth (d3+d2).

Figure 7:
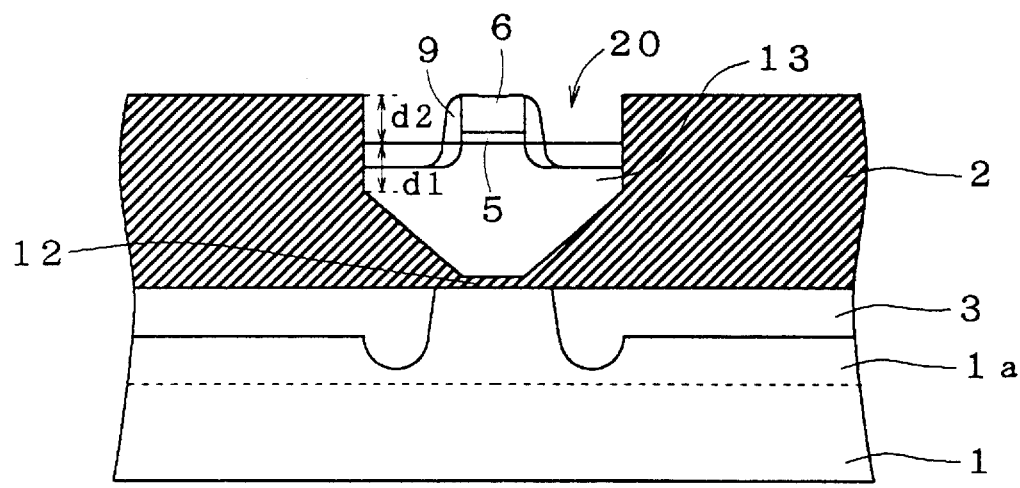
FIG. 7 is a sectional view showing an element isolation method according to an embodiment 3 of the present invention.

Then, an NMOS transistor is so formed that upper ends of a thermal oxide film 2 and a polysilicon gate electrode 6 are flush with each other as shown in FIG. 7, by a method similar to the element isolation method according to the embodiment 1.

In the element isolation method according to the embodiment 2, as described above, the epitaxial silicon layer 4 is so formed in the groove 20 that a space corresponding to a height of formation of a semiconductor element above the epitaxial silicon layer 4 remains as the unfilled space in an upper part of the groove 20, whereby wires 10 and a protective film 11 can be relatively readily flattened and formed in small thicknesses respectively, in addition to the effect of the embodiment 1.

<Embodiment 3>

Figure 6:
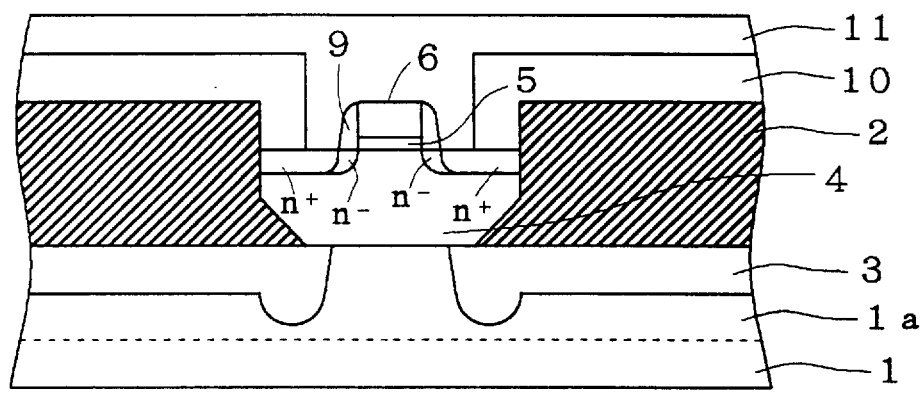
FIG. 6 is a sectional view showing the element isolation method according to the embodiment 2 of the present invention.

The structure fabricated by the element isolation method according to the embodiment 2 shown in FIGS. 5 and 6 has advantages of no halation, formation of no bird's beak and an extremely small fine leakage current due to no stress caused by oxidation, while the isolation withstand voltage is increased and the element formation region can be widely taken since a silicon substrate side (taper portion) of the element isolation oxide film is long and a surface side is short as compared with the conventional LOCOS isolation structure.

As shown in FIG. 7, an element isolation method according to an embodiment 3 of the present invention further promotes this structure. According to this method, a groove 20 is formed not to pass through a thermal oxide film 2 while lower side walls of the groove 20 are inwardly tapered to leave the thermal oxide film 2 on the bottom surface. Assuming that d2 represents the depth of an unfilled space in an upper part of the groove 20, the groove 20 is vertically shaped up to a depth (d3+d2) and inwardly tapered in a portion deeper than the depth (d3+d2), similarly to the embodiment 2.

An oxide film 12 remaining on the bottom portion of the groove 20 is called a buried oxide film. In this case, no silicon substrate 1 is exposed on the bottom surface of the groove 20, and hence the groove 20 cannot be filled up with an epitaxial silicon layer. Alternatively, the groove 20 is filled up with a non-monocrystalline silicon layer 13 consisting of amorphous silicon or polysilicon.

Thus, the structure obtained by the element isolation method according to the embodiment 3 is called an SOI (silicon on insulator) structure. The SOI structure has an advantage of hardly causing a soft error resulting in a malfunction of the semiconductor element by secondary carriers which are generated upon irradiation of the silicon substrate with alpha rays emitted from uranium, thorium etc. which are contained in the package in small amounts.

The SOI structure can be formed by a method, called a SIMOX (separation implanted oxygen) method, of implanting oxygen ions into the silicon substrate 1 and thereafter heat treating the same at a high temperature. The SIMOX method has such disadvantages that it is difficult to partially connect the substrate with an SOI layer through a silicon layer, and this method is at a high cost.

In the element isolation method according to the embodiment 3 of the present invention, an optimum SOI structure can be selectively formed by adjusting the width of the element formation region and the taper angle of anisotropic etching.

<Embodiment 4>

In the element isolation method according to the embodiment 3 shown in FIG. 7, the material for the non-monocrystalline silicon layer 13 which is the SOI layer is limited to polysilicon or amorphous silicon. When the SO layer is not made of monocrystalline silicon, however, carrier mobility is disadvantageously reduced to lower the element speed.

Figure 8:
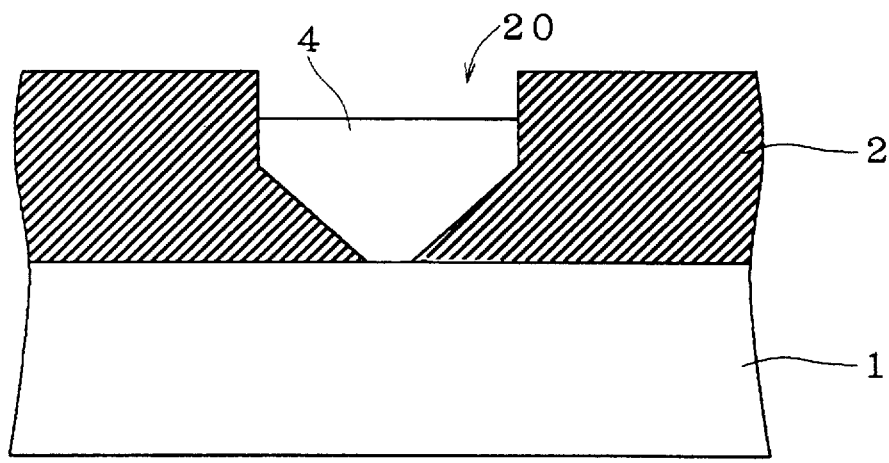
FIG. 8 is a sectional view showing an element isolation method according to an embodiment 4 of the present invention.

In an element isolation method according to an embodiment 4 of the present invention, therefore, a groove 20 is formed with a taper so that a small region of a silicon substrate 1 is exposed on its bottom surface as a first stage of formation of the groove 20, as shown in FIG. 8. The small exposed region of the silicon substrate 1 is employed as a seed crystal, for forming an epitaxial silicon layer 4.

Figure 9:
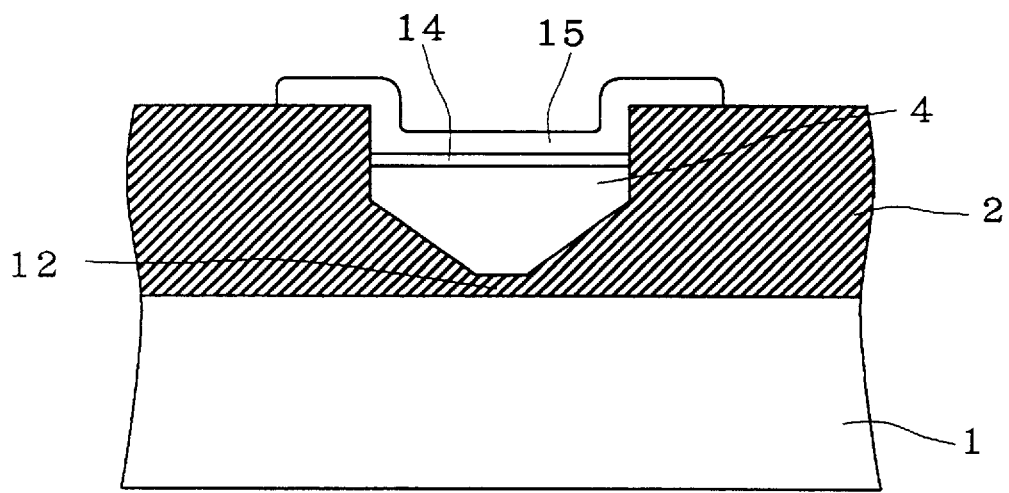
FIG. 9 is a sectional view showing the element isolation method according to the embodiment 4 of the present invention.

Thereafter an underlayer oxide film 14 is formed on the surface of the epitaxial silicon layer 4, so that a nitride film 15 is deposited as shown in FIG. 9. Thereafter oxidation treatment is so performed that a thermal oxide film 2 is grown to form a buried oxide film 12 between the epitaxial silicon layer 4 and the silicon substrate 1. At this time, the epitaxial silicon layer 4 which is an SOI layer is hardly oxidized due to protection by the nitride film 15. Thus, an SOI layer (epitaxial silicon layer 4) consisting of monocrystalline silicon can be formed.

As described above, the SOI layer can be formed by a single crystal in the element isolation method according to the embodiment 4 of the present invention, whereby carrier mobility can be improved to attain a high element speed in addition to the effect of the embodiment 3.

<Embodiment 5>

In each of the embodiments 1 to 4, only a single epitaxial silicon layer 4 which is an element formation region is shown for convenience of illustration. In practice, however, a plurality of grooves 20 are formed on the thermal oxide film 2 due to element isolation by the remaining thermal oxide film 2, and these grooves 20 are filled up for forming a plurality of epitaxial silicon layers 4 respectively.

An element isolation method according to an embodiment 5 is adapted to epitaxially grow a plurality of epitaxial silicon layers 4 in impurity distributions which are different from each other.

Consequently, the element isolation method according to the embodiment 5 of the present invention can set impurity distributions which are suitable for semiconductor elements formed in the epitaxial silicon layers 4 respectively.

Figure 10:
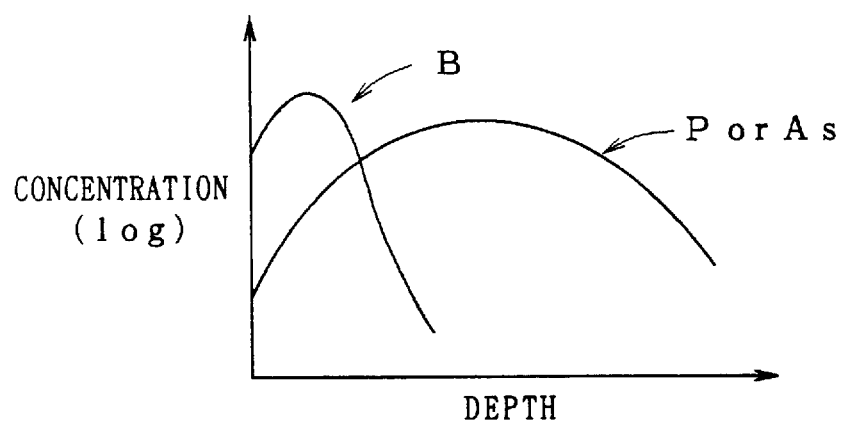
FIG. 10 is a graph showing an impurity profile by conventional ion implantation.

Consider the case of forming PMOS transistors, for example. FIG. 10 shows impurity distributions of channel regions of conventional buried type PMOS transistors along the direction of depth. These distributions are generally formed by ion implantation, and hence it is difficult to attain steeply changed distributions.

Figure 11:
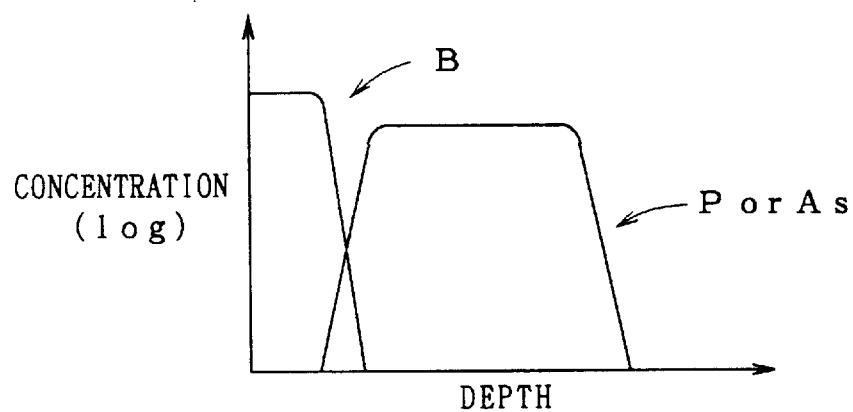
FIG. 11 is a graph showing an impurity profile of an epitaxial silicon layer fabricated by an element isolation method according to an embodiment 5 of the present invention.

In the element isolation method according to the embodiment 5 of the present invention, on the other hand, the epitaxial silicon layers 4 for forming PMOS transistors can be selectively epitaxially grown to attain distributions which are steeply changed in the vicinity of junctions, as shown in FIG. 11.

Consequently, the PMOS transistors provided with channel regions having the impurity distributions shown in FIG. 11 hardly cause punch-through phenomenons, whereby current control by gate voltages can advantageously be performed in high accuracy.

<Embodiment 6>

Figure 12:
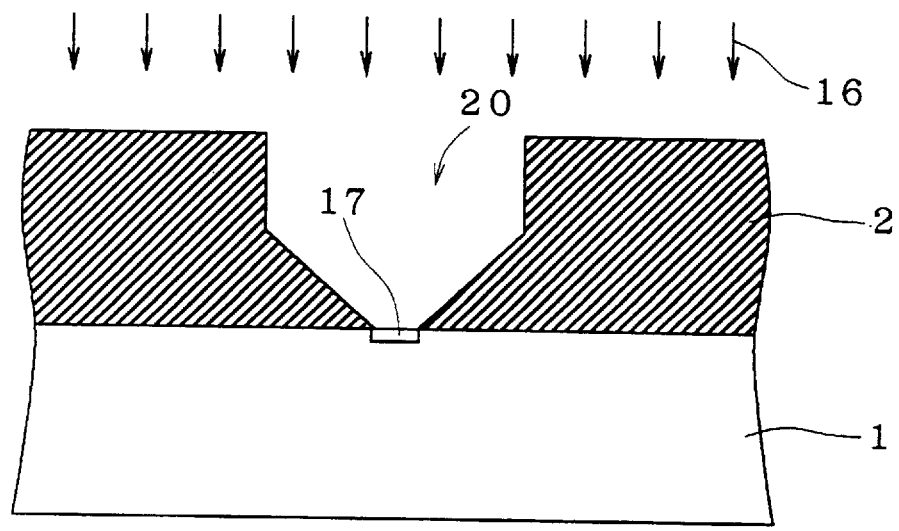
FIG. 12 is a sectional view showing an element isolation method according to an embodiment 6 of the present invention.

The layer for an element formation region is not restricted to silicon but may alternatively be made of another material. An element isolation method according to an embodiment 6 of the present invention is adapted to define an element formation region by a gallium arsenide layer 18. A groove 20 is formed in a thermal oxide film 2 similarly to the embodiment 2, and thereafter silicon ions 16 are implanted as shown in FIG. 12, for example, for bringing the surface of a silicon substrate 1 into an amorphous state and forming an amorphous layer 17. The amorphous layer 17 is formed by disturbing the crystal structure on the surface of the silicon substrate 1 and forming interstitial silicon in its interior, so that a plurality of silicon atoms having spaces close to the lattice constant of gallium arsenide are present on the surface due to the interstitial silicon.

Figure 13:
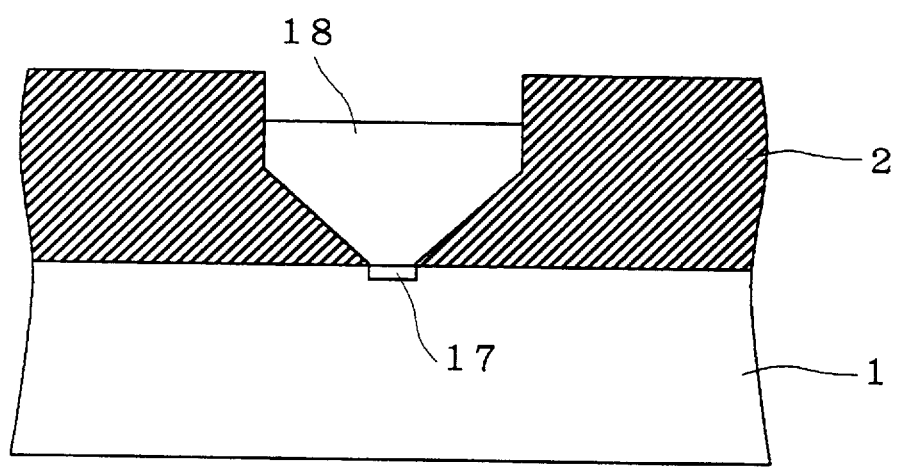
FIG. 13 is a sectional view showing the element isolation method according to the embodiment 6 of the present invention.
Figure 14:
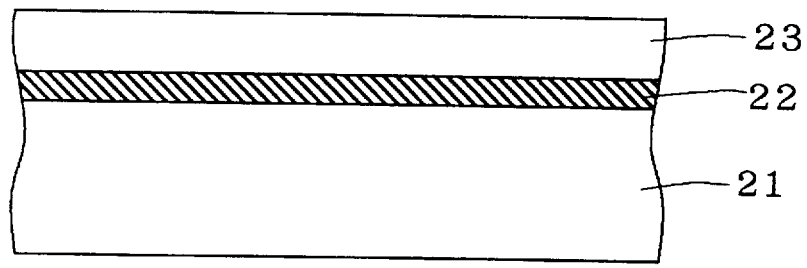
FIG. 14 is a sectional view showing a conventional LOCOS method.
Figure 15:
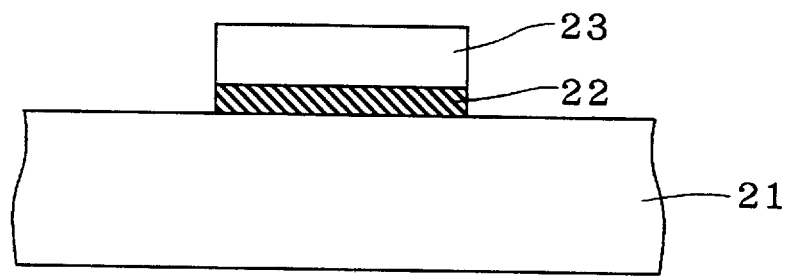
FIG. 15 is a sectional view showing the conventional LOCOS method.
Figure 16:
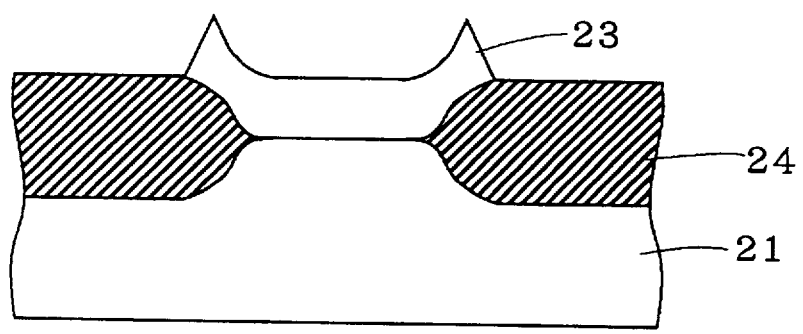
FIG. 16 is a sectional view showing the conventional LOCOS method.
Figure 17:
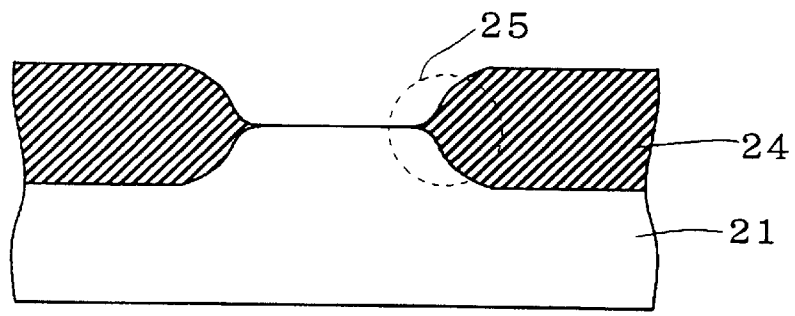
FIG. 17 is a sectional view showing the conventional LOCOS method.
Figure 18:
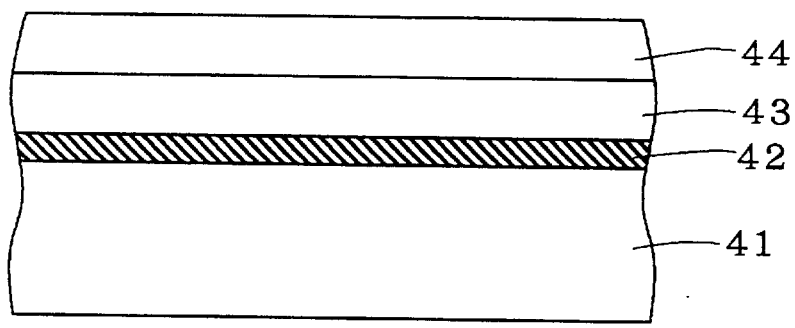
FIG. 18 is a sectional view showing a first mode of a conventional improved LOCOS method.
Figure 19:
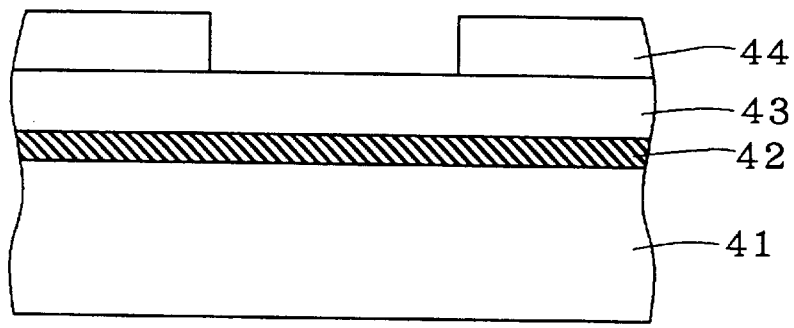
FIG. 19 is a sectional view showing the first mode of the conventional improved LOCOS method.
Figure 20:
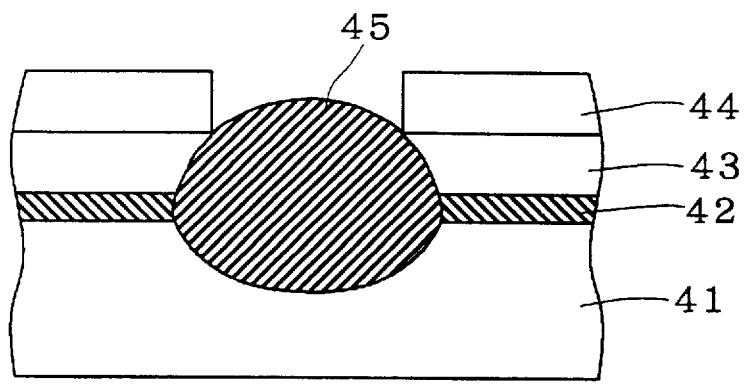
FIG. 20 is a sectional view showing the first mode of the conventional improved LOCOS method.
Figure 21:
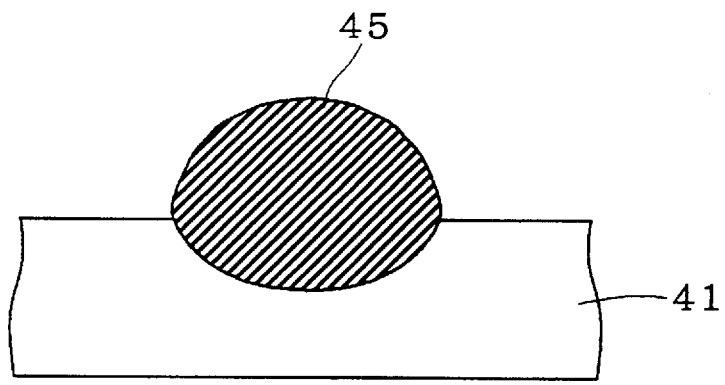
FIG. 21 is a sectional view showing the first mode of the conventional improved LOCOS method.
Figure 22:
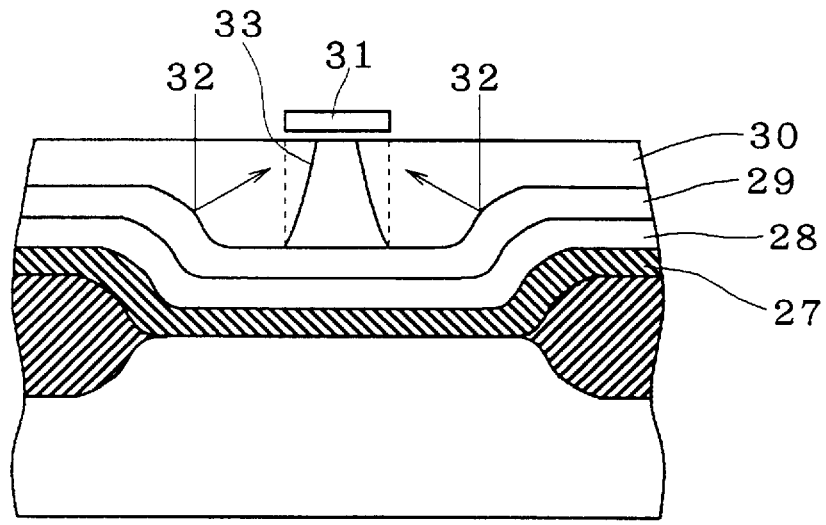
FIG. 22 is a sectional view showing a problem of the conventional improved LOCOS method.
Figure 23:
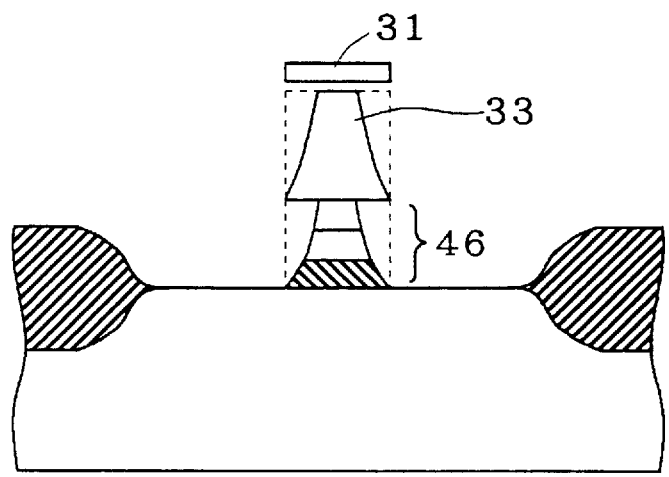
FIG. 23 is a sectional view showing the problem of the conventional improved LOCOS method.
Figure 24:
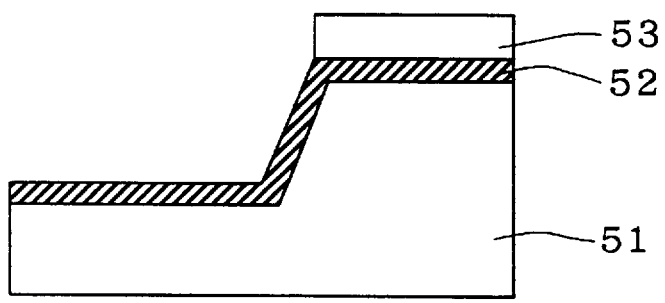
FIG. 24 is a sectional view showing a second mode of the conventional improved LOCOS method.
Figure 25:
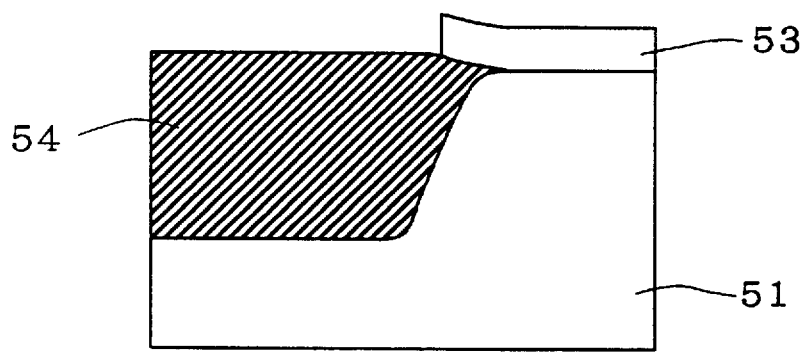
FIG. 25 is a sectional view showing the second mode of the conventional improved LOCOS method.
Figure 26:
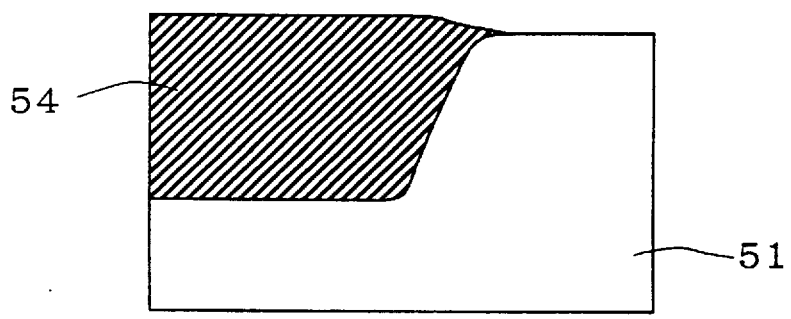
FIG. 26 is a sectional view showing the second mode of the conventional improved LOCOS method.
Figure 27:
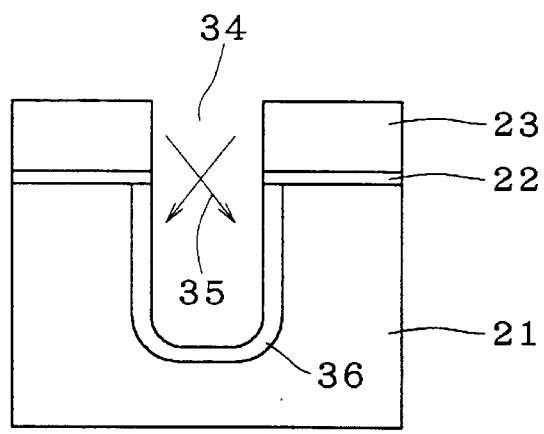
FIG. 27 is a sectional view showing a conventional trench isolation method.
Figure 28:
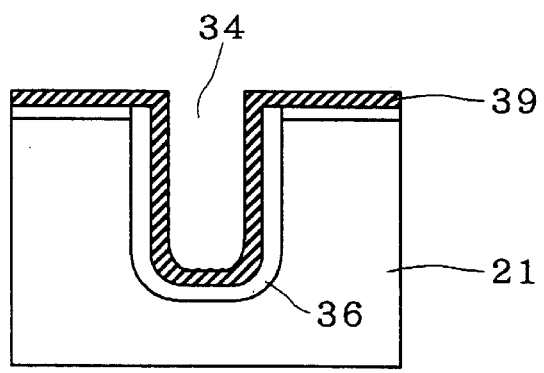
FIG. 28 is a sectional view showing the conventional trench isolation method.
Figure 29:
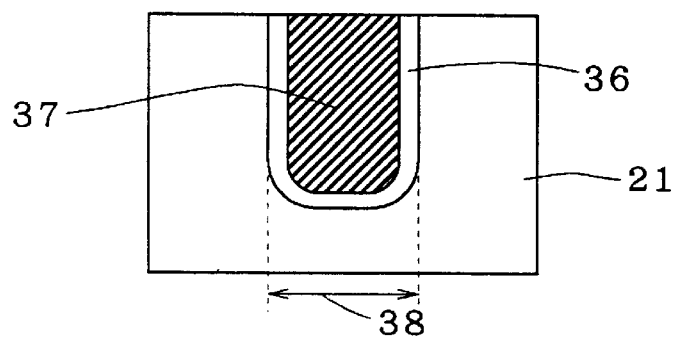
FIG. 29 is a sectional view showing the conventional trench isolation method.

Thereafter gallium arsenide is grown to form a gallium arsenide layer 18, as shown in FIG. 13. The amorphous layer 17 is formed in advance for relaxing the difference between the lattice constants of silicon and gallium arsenide for simplifying connection between the silicon substrate 1 and the gallium arsenide layer 18 through the amorphous layer 17. The gallium arsenide has higher mobility than the silicon, whereby a semiconductor element having excellent switching accuracy can be obtained by forming the semiconductor element in the gallium arsenide layer 18. Alternatively, a bipolar transistor (not shown) employing SiGe can be formed.

In the element isolation method according to the embodiment 6, as described above, a semiconductor element having superior switching accuracy can be obtained due to the formation of the gallium arsenide layer serving as an element formation region.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a semiconductor device which is subjected to element isolation by an oxide film, said method comprising the steps of:

(a) preparing a semiconductor substrate;

(b) forming an oxide film on said semiconductor substrate;

(c) selectively removing said oxide film to form a groove in the oxide film to a prescribed depth d1 and continuing the removal of said oxide film in an inward taper downwardly toward the semiconductor substrate;

(d) filling the groove with a material to form a semiconductor region; and (e) forming a semiconductor element in a region of the semiconductor region within the prescribed depth d1, at least a portion of which is underneath the semiconductor element.

2. The method of fabricating a semiconductor device in accordance with claim 1, wherein said step (c) comprises:

(C-1) selectively removing said oxide film to form said groove passing through a part of said oxide film and having a bottom surface being defined by an exposed surface of said semiconductor substrate.

3. The method of fabricating a semiconductor device in accordance with claim 2, wherein said step (d) is adapted to form said semiconductor region in a manner which leaves an unfilled space in an upper part of said groove.

4. The method of fabricating a semiconductor device in accordance with claim 3, wherein said step (d) is adapted to form said semiconductor region so that the surface of said semiconductor region is flush with that of said oxide film.

5. The method of fabricating a semiconductor device in accordance with claim 2, wherein said step (c-1) comprises the steps of:

(c-1-1) vertically performing anisotropic etching on the surface of said semiconductor substrate up to said prescribed depth from the surface of said oxide film, and (c-1-2) performing anisotropic etching over said prescribed depth and the surface of said semiconductor substrate while changing etching conditions so that the surface of said semiconductor substrate is inwardly tapered.

6. The method of fabricating a semiconductor device in accordance with claim 2, wherein said step (d) comprises the steps of:

(d-1) forming an amorphous layer on said bottom surface of said groove, and (d-2) filling up said groove to form a partial semiconductor region which is different in semiconductor type from said semiconductor substrate and forming said semiconductor region by said amorphous layer and said partial semiconductor region.

7. The method of fabricating a semiconductor device in accordance with claim 6, wherein said step (d-2) is adapted to form said partial semiconductor region to leave an unfilled space in an upper part of said groove.

8. The method of fabricating a semiconductor device in accordance with claim 1, wherein said step (c) comprises (c-1) selectively removing said oxide film to form said groove without passing through said oxide film.

9. The method of fabricating a semiconductor device in accordance with claim 8, wherein said step (d) is adapted to form said semiconductor region which leaves an unfilled space in an upper part of said groove.

10. The method of fabricating a semiconductor device in accordance with claim 6, wherein said step (c) comprises:

(c-1) selectively removing said oxide film to form a through groove passing through a part of said oxide film, said step(d) comprises:

(d-2) after said step (c-1), filling up said through groove to form monocrystalline said semiconductor region, and said step (c) further comprises:

(c-2) after said step (d-2), performing an oxidation treatment so that said oxide film is grown to form a second oxide film between said semiconductor region and said semiconductor substrate, to thereby form said groove having a bottom portion being defined by said second oxide film.

11. The method of fabricating a semiconductor device in accordance with claim 10, further comprising the step of:

(c-3) forming an oxidation suppression film having a property of suppressing oxidation of said semiconductor region on the surface of said semiconductor region between said steps (d) and (c-2).

12. The method of fabricating a semiconductor device in accordance with claim 10, wherein said step (d) is adapted to form said semiconductor region which leaves an unfilled space in an upper part of said through groove.

13. The method of fabricating a semiconductor device in accordance with claim 1, wherein said groove includes a plurality of grooves and said semiconductor region includes a plurality of semiconductor regions, said step (c) is adapted to fill up said plurality of grooves form said plurality of semiconductor regions respectively, and said plurality of semiconductor regions are formed by epitaxy with seeds being defined by said semiconductor substrate respectively, impurity distributions of said plurality of semiconductor regions being set to be different from each other.

14. The method of fabricating a semiconductor device in accordance with claim 13, wherein at least one of said plurality of semiconductor regions has an impurity distribution being steeply changed in a region close to a P-N junction.

15. A semiconductor device comprising:

a semiconductor substrate;

an oxide film formed on said oxide substrate, said oxide film provided on its surface with a groove having an opening, said groove inwardly tapering in a portion which is deeper than a prescribed depth d1 from the surface of said oxide film;

a semiconductor region of material which fills said grooves; and a semiconductor element formed in a region of said semiconductor region which is shallower than said prescribed depth d1, said taper of said groove being positioned below at least a part of a diffusion region which forms said semiconductor element.

16. The semiconductor device in accordance with claim 15, wherein the bottom surface of said groove is defined by the surface of said semiconductor substrate.

17. The semiconductor device in accordance with claim 15, wherein the bottom surface of said groove is defined by a part of said oxide film.

18. The semiconductor device in accordance with claim 15, wherein said semiconductor region comprises:

an amorphous layer which is formed on the bottom surface of said groove, and a partial semiconductor region which is formed on said amorphous layer by filling up said groove, said partial semiconductor region being different in semiconductor type from said semiconductor substrate.

19. A semiconductor device comprising:

a semiconductor substrate;

an oxide film formed on said semiconductor substrate, said oxide film provided on its surface with a groove having an opening, said groove inwardly tapering in a portion which is deeper than a prescribed depth d1 from the surface of said oxide film;

a semiconductor region of material which partially fills said groove up to a height which is lower than that of the surface of said oxide film; and a semiconductor element formed above the semiconductor region, the uppermost portion of said semiconductor element being flush with the surface of said oxide film, said taper of said groove being positioned below at least a part of a diffusion region which forms said semiconductor element.

* * * * *